(12) United States Patent
Nagai et al.

(10) Patent No.: US 7,491,974 B2
(45) Date of Patent: Feb. 17, 2009

(54) LIGHT-EMITTING DEVICE

(75) Inventors: Youichi Nagai, Osaka (JP); Koji Katayama, Itami (JP); Hiroyuki Kitabayashi, Itami (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 193 days.

(21) Appl. No.: 11/365,642

(22) Filed: Feb. 28, 2006

(65) Prior Publication Data

US 2006/0278864 A1    Dec. 14, 2006

(30) Foreign Application Priority Data

Jun. 13, 2005    (JP) .............................. 2005-172364

(51) Int. Cl.
*H01L 27/15* (2006.01)

(52) U.S. Cl. .................. 257/79; 257/13; 257/E27.12; 438/22

(58) Field of Classification Search .................. 257/13, 257/79; 362/84; 438/22
See application file for complete search history.

(56) References Cited

U.S. PATENT DOCUMENTS

| | | | | |
|---|---|---|---|---|
| 6,791,117 B2 * | 9/2004 | Yoshitake et al. | ............. | 257/94 |
| 2002/0136932 A1 * | 9/2002 | Yoshida | ...................... | 428/698 |
| 2003/0132445 A1 * | 7/2003 | Yoshitake et al. | ............. | 257/84 |
| 2005/0062060 A1 | 3/2005 | Nagai et al. | | |
| 2005/0285136 A1 * | 12/2005 | Ou et al. | ...................... | 257/103 |

FOREIGN PATENT DOCUMENTS

| | | |
|---|---|---|
| EP | 1538680 A2 | 6/2005 |
| JP | 11-340506 A | 12/1999 |
| JP | 2001-148508 A | 5/2001 |
| JP | 2003-069075 A | 3/2003 |
| JP | 2004-80050 | 3/2004 |
| WO | WO-03/100873 A1 | 12/2003 |

* cited by examiner

*Primary Examiner*—Jerome Jackson, Jr.
*Assistant Examiner*—Jami M Valentine
(74) *Attorney, Agent, or Firm*—Darby & Darby P.C.

(57) ABSTRACT

A light-emitting device is equipped with a GaN substrate; an n-type $Al_xGa_{1-x}N$ layer on a first main surface side of the GaN substrate; a p-type $Al_xGa_{1-x}N$ layer positioned further away from the GaN substrate than the n-type $Al_xGa_{1-x}N$ layer; and a multi-quantum well (MQW) positioned between the n-type $Al_xGa_{1-x}N$ layer and the p-type $Al_xGa_{1-x}N$ layer. In the light-emitting device, the p-type $Al_xGa_{1-x}N$ layer side is down-mounted and light is emitted from a second main surface, which is the main surface opposite from the first main surface of the GaN substrate. The second main surface of the GaN substrate includes a region on which cavities and projections are formed. Also, the light-emitting device includes an n-electrode formed on the second main surface of the GaN substrate 1 and a protective film formed to cover the side wall of the n-electrode.

15 Claims, 6 Drawing Sheets

LIGHT-EMITTING DEVICE

INCORPORATION BY REFERENCE

The present application claims priority under 35 U.S.C. §119 to Japanese Patent Application No. 2005-172364 filed on Jun. 13, 2005 in the Japanese language, which is hereby incorporated by reference in its entirety.

BACKGROUND OF THE INVENTION

1. Field of the Invention

The present invention relates to a light-emitting device. More specifically, the present invention relates to a light-emitting device formed from a nitride semiconductor. In the present invention, a "light-emitting device" may refer solely to a semiconductor element or a semiconductor chip formed essentially from a nitride semiconductor substrate and a semiconductor layer laminated thereon, or may refer solely to a device wherein a semiconductor chip is mounted on a mounting part and sealed in resin. Also, the term may be used with both of these meanings at the same time. The semiconductor chip may also be referred to simply as a "chip". Also, in a chip, the substrate and the epitaxial layer formed thereon may be referred to simply as a "substrate".

2. Description of the Background Art

Currently, white light-emitting diodes (LED) are frequently used for illumination and compact electronic devices such as portable information terminals. However, there is the potential that they may be used for illumination in large spaces or over large areas in the future. To make it possible to use LEDs for illumination of large spaces and large areas, the light output of LEDs must be increased.

One strategy for increasing LED light output is to allow the light generated within the LED to be efficiently output to the outside, i.e., to improve light extraction efficiency. In one proposed technology for improving light extraction efficiency, e.g., see Japanese Laid-Open Patent Publication Number 2003-69075, a nitride semiconductor layer is grown on a base substrate formed from sapphire or the like. The base substrate is removed from the grown nitride semiconductor layer, and the surface of the resulting nitride semiconductor substrate formed from this nitride semiconductor layer is processed by wet etching, dry etching, abrasion, or the like to form cavities and projections (i.e., to form a non-specular surface). In Japanese Laid-Open Patent Publication Number 2003-69075, the formation of these cavities and projections reduces optical interference caused by multiple reflections in the nitride semiconductor substrate, thus improving light extraction efficiency.

However, in the technology described in Japanese Laid-Open Patent Publication Number 2003-69075, if wet etching, which is the simplest method for forming cavities and projections, is used, and electrodes have already been formed on the nitride semiconductor substrate surface, the wet etching operation may damage the electrodes (or may remove the electrodes). This prevents the predetermined current from being supplied from the electrodes to the light-emitting device, resulting in the inability to perform as a light-emitting device and the inability to provide a light-emitting device with improved light extraction efficiency.

The object of the present invention is to overcome the problems described above and to provide a light-emitting device with improved light extraction efficiency.

SUMMARY OF THE INVENTION

A light-emitting device according to the present invention includes: a nitride semiconductor substrate; an n-type nitride semiconductor layer on a first main surface side of the nitride semiconductor substrate; a p-type nitride semiconductor substrate positioned further away from the nitride semiconductor substrate compared to the n-type nitride semiconductor layer; and a light-emitting layer positioned between the n-type nitride semiconductor layer and the p-type nitride semiconductor layer. The p-type nitride semiconductor layer side is down-mounted and light is emitted from a second main surface, which is a main surface opposite from the first main surface of the nitride semiconductor substrate. The second main surface of the nitride semiconductor substrate includes a region formed with cavities and projections. Also, the light-emitting device described above includes an electrode formed on the second main surface of the nitride semiconductor substrate and a protective film formed to cover the side wall of the electrode.

In the light-emitting device of the present invention, since the protective film is formed on the side wall to protect the side wall of the electrode, when the second main surface (the N surface of the GaN substrate) is to have a non-specular finish (formed with cavities and projections), it is possible to reduce the chance that the side wall of the electrode will be corroded by the etching operation, resulting in the removal of the electrode from the second main surface of the GaN substrate. Also, by forming a protective film on the side wall (side surface) of the electrode in this manner, it is possible to form the electrode on the second main surface of the GaN substrate ahead of time before the non-specular finish is applied. As a result, when the electrode is to be formed on the main surface on the second main surface after the second main surface has received a non-specular finish, it is possible to prevent problems such as the inability to reliably form electrodes on the second main surface that has received a non-specular finish (formed with cavities and projections), i.e., the electrode tends to peel away from the second main surface or wire bonding becomes difficult during subsequent mounting to the lead frame.

Also, by forming the protective film on the side wall of the electrode, the number of production steps for the light-emitting device can be reduced compared to other methods (e.g., forming a film over a region of the second main surface on which the electrode is to be formed, applying a non-specular finish, removing the cover, and forming the electrode).

Also, by forming the protective film on the side wall of the electrode as described above, the electrode can be formed before the non-specular finish when the second main surface is flat, thus maintaining good adhesion at the contact section between the electrode and the nitride semiconductor substrate. As a result, the contact resistance at the contact section can be made adequately low, providing a light-emitting device with superior light emission efficiency without increasing the drive voltage (power consumption) of the light-emitting device.

Also, since cavities and projections are formed on the second main surface, a greater surface area on the second main surface can be provided compared to when cavities and projections are not formed. As a result, light can be efficiently extracted from the cavities and projections, thus providing a light-emitting device with high light extraction efficiency.

With the present invention as described above, a protective film is formed on the side wall of the electrode so that cavities and projections can be formed on the second main surface of the nitride semiconductor substrate without eliminating the electrode. As a result, it is possible to provide a light-emitting device with high light extraction efficiency.

DETAILED DESCRIPTION OF THE INVENTION

Figure 1:
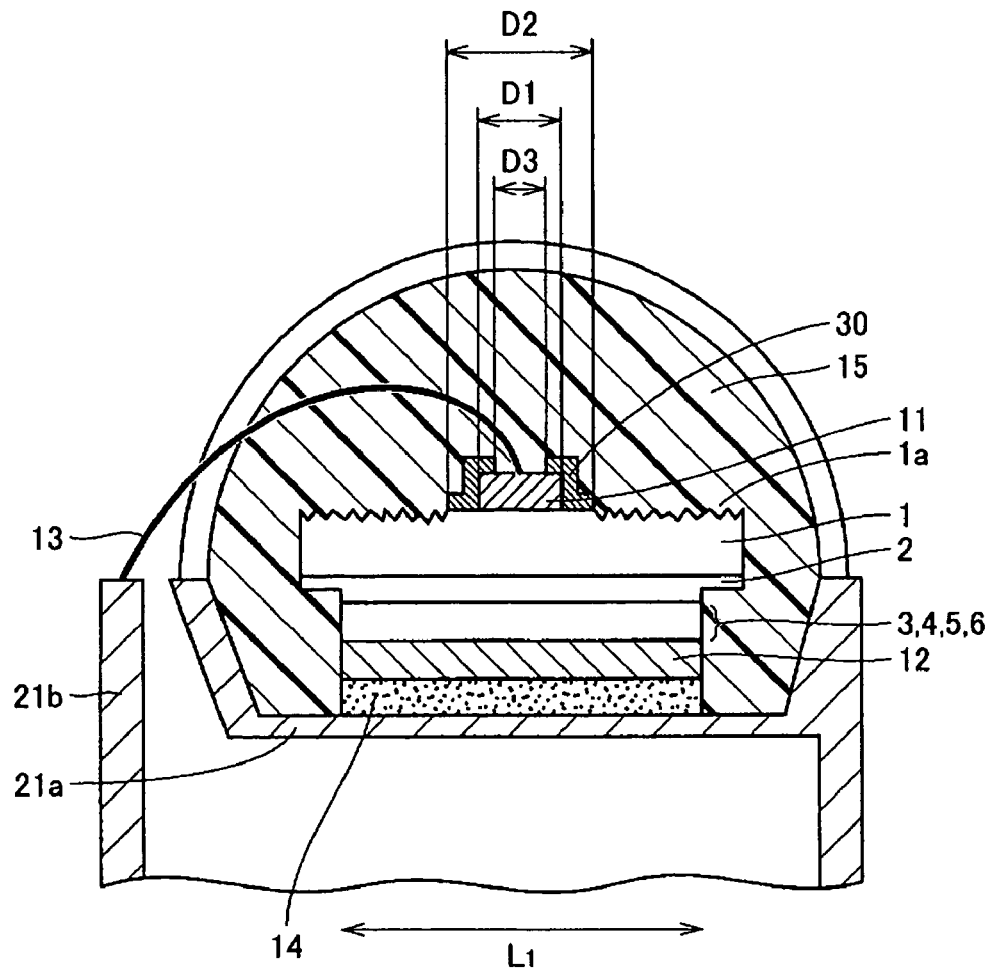
FIG. 1 is a drawing showing an embodiment of an LED serving as a light-emitting device according to the present invention.

The embodiments and examples of the present invention will be described, with references to the drawings. In the drawings, like elements will be assigned like numerals and their descriptions will not be repeated.

Figure 2:
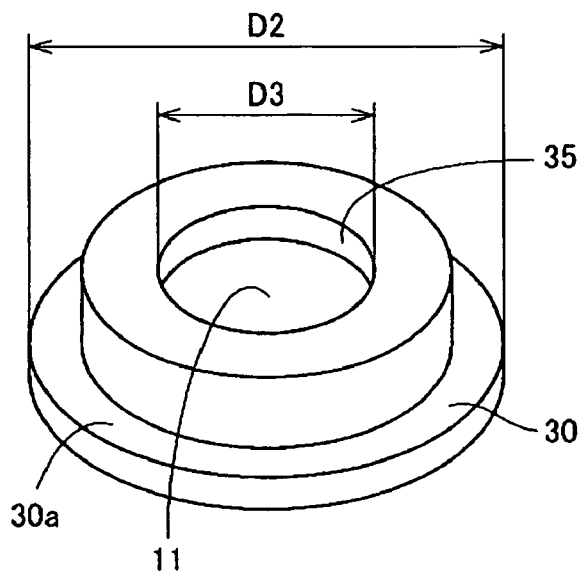
FIG. 2 is a perspective drawing showing the n-electrode of the LED shown in FIG. 1.
Figure 3:
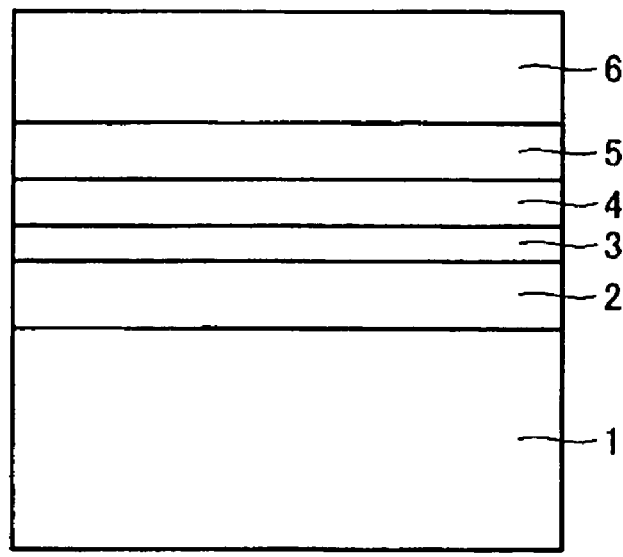
FIG. 3 is a drawing showing a layered structure containing the light-emitting layer of the LED in FIG. 1.

FIG. 1 shows an embodiment of an LED serving as a light-emitting device according to the present invention. FIG. 2 is a perspective drawing showing an n-electrode of the LED in FIG. 1. FIG. 3 shows a layered structure containing the light-emitting layer of the LED in FIG. 1. An embodiment of an LED according to the present invention will be described, with references to FIG. 1 through FIG. 3.

As shown in FIG. 1, a layered structure containing a light-emitting layer that will be described in detail later and the like and a p-electrode 12 are disposed on a first main surface side of a GaN substrate 1. In this embodiment, the p-electrode 12 is down-mounted on a lead-frame mount 21a using a conductive adhesive 14.

A second main surface 1a of the GaN substrate 1 is a surface that emits light emitted by the light-emitting layer, and an n-electrode 11 is disposed on this surface. This second main surface 1a is formed with a non-specular finish section (a rough section with cavities and projections) formed by wet etching using KOH as the etching solution. The n-electrode 11 is disposed roughly at the center of the second main surface 1a so that not all of the surface of the second main surface 1a is covered. However, it is important to have a large proportion of the n-electrode 11 uncovered. With a large opening ratio, the light blocked by the n-electrode 11 is reduced and the emission efficiency of the light emitted to the outside is increased.

A protective film 30 is formed on the side wall of the n-electrode 11. The protective film 30 can be a conductor such as a metal, e.g., nickel, or an insulator. The protective film 30 can be formed from any material as long as it is resistant to the etching solution used in the wet etching described above. As shown in FIG. 2, the protective film 30 covers the side wall of the n-electrode 11, and includes a flange 30a with an outer diameter D2 that extends over the second main surface 1a adjacent to the n-electrode 11. Also, the protective film 30 includes an extension that covers the outer perimeter section of the upper surface of the n-electrode 11. Above the upper surface of the n-electrode 11, the protective film 30 is formed with an opening 35 with a diameter D3 that exposes a section of the upper surface of the n-electrode 11.

The upper surface of the n-electrode 11 exposed through the opening 35 is electrically connected to a lead 21b of a lead frame by way of a wire 13. The wire 13 and the layered structure described above are sealed with an epoxy-based resin 15 serving as a sealing member. In the structure described above, the layered structure from the GaN substrate 1 to the p-electrode 12 is shown in detail in FIG. 3. In FIG. 3, the layered structure is vertically inverted relative to FIG. 1.

As shown in FIG. 3, an n-type GaN epitaxial layer 2 is positioned on top of the GaN substrate 1 and an n-type $Al_xGa_{1-x}N$ layer 3 is formed on top of this. On top of this, a multi-quantum well (MQW) 4 is formed from an $Al_xGa_{1-x}N$ layer and an $Al_xIn_yGa_{1-x-y}N$ layer. A p-type $Al_xGa_{1-x}N$ layer 5 is disposed so that the multi-quantum well 4 is interposed between it and the n-type $Al_xGa_{1-x}N$ layer 3. Also, a p-type GaN layer 6 is disposed on top of the p-type $Al_xGa_{1-x}N$ layer 5. In the structure described above, light emission takes place at the multi-quantum well 4. Also, as shown in FIG. 1, a p-electrode 12 is formed and down-mounted on the p-type GaN layer 6 so that the entire upper surface of the p-type GaN layer 6 is covered.

Figure 4:
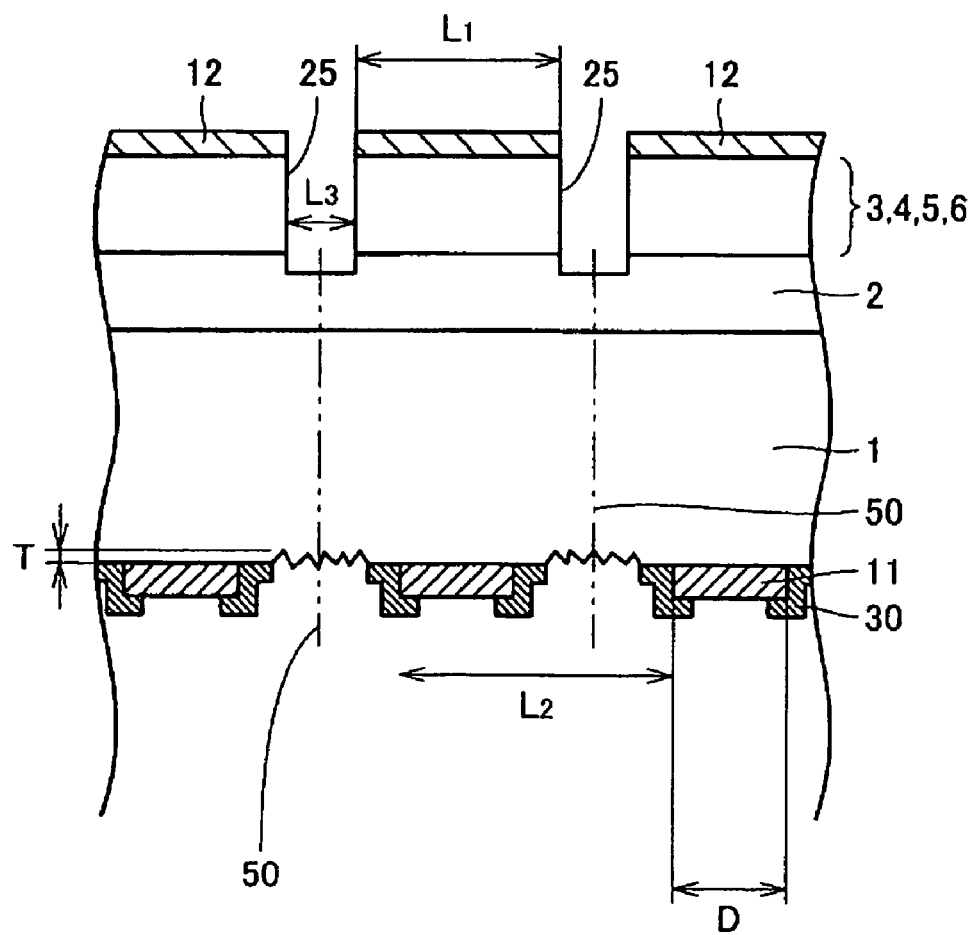
FIG. 4 is a drawing showing the state of a wafer when a chip having the structure shown in FIG. 2 is to be taken from the wafer.
Figure 5:
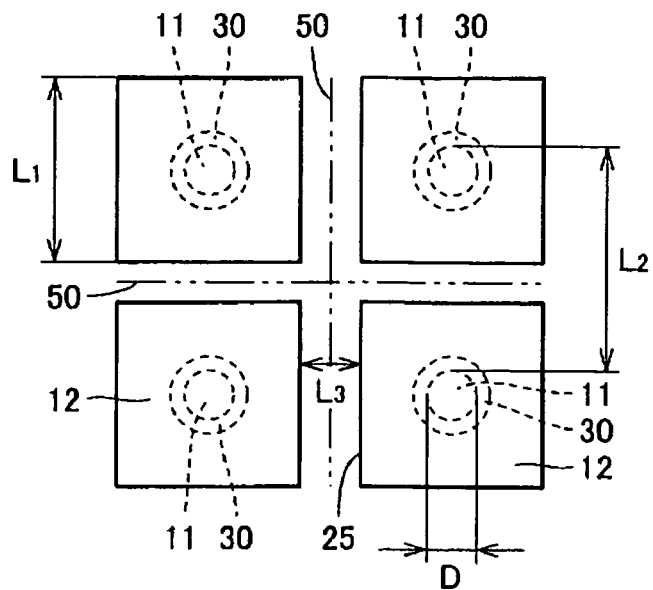
FIG. 5 is a drawing showing the arrangement of the electrodes shown in FIG. 4.

Next, referring to FIG. 4 and FIG. 5, a method for making the LED shown in FIG. 1 through FIG. 3 will be described. FIG. 4 shows the state of a wafer when a chip having a structure as shown in FIG. 2 is to be harvested from the wafer. FIG. 5 is a figure that shows the arrangement of electrodes shown in FIG. 4.

First, a substrate preparation step (S10) is performed. More specifically, a GaN substrate is prepared. Then, using a film-forming method such as MOCVD (metal organic chemical vapor deposition), a layered structure (Si-doped n-type GaN layer/Si-doped n-type $Al_{0.2}Ga_{0.8}N$ layer serving as a clad layer/multi-quantum well formed by stacking multiple two-layer structures consisting of a GaN layer and an $In_{0.15}Ga_{0.85}N$ layer/Mg-doped p-type $Al_{0.2}Ga_{0.8}N$ layer serving as a clad layer/Mg-doped p-type GaN layer) is formed on the first main surface of the GaN substrate. Next, this wafer can be activated and the resistance of the Mg-doped p-type layer can be reduced. The wafer is etched with a Cl-based gas from the Mg-doped p-type layer side to the Si-doped n-type layer using photolithography and RIE (Reactive Ion Etching). As shown in FIG. 4, this etching forms element separation grooves 25 that separate the elements.

Next, an electrode formation step (S20) is performed. More specifically, photolithography, vapor deposition, and lift-off is performed on the N surface of the back, which is the second main surface of the GaN substrate, to form n-electrodes 11 with a circular shape when seen from above at the center of the chips at a predetermined pitch (distance $L_2$) (see FIG. 4 and FIG. 5). The n-electrode 11 can be formed as a layered structure (starting from the bottom, Ti layer/Al layer/Ti layer/Au layer) in contact with the GaN substrate. In order to have the contact resistance between the n-electrode 11 and the back surface of the GaN substrate be a predetermined value, the GaN substrate is heated in a nitrogen ($N_2$) atmosphere.

Next, a protective film formation step (S30) is performed. More specifically, the protective film 30 as shown in FIG. 2 is formed to cover the side wall of the n-electrode 11. The protective film 30 is formed so that the center of the opening 35 of the protective film 30 is essentially aligned with the center of the upper surface of the n-electrode 11. The protective film 30 can be formed with any method, e.g., vapor deposition.

Next, a non-specular finishing step (S40) is performed. More specifically, non-specular finishing is performed by performing wet etching on the second main surface 1a of the GaN substrate 1. In this wet etching, a KOH solution can be used as the etching solution.

Next, a conductor layer adjacent to the p-type GaN layer and having a predetermined thickness is formed as the p-electrode. For the conductor layer, it would be possible, for example, to form an Ni layer with a predetermined thickness so that it is in contact with the GaN layer, and an Au layer with a predetermined thickness can be formed above this over the entire surface (see FIG. 4 and FIG. 5). In this case, in order to have the contact resistance of the p-electrode and the p-type GaN electrode be a predetermined value, the GaN substrate can be heated in an inert gas atmosphere.

As shown in FIG. 4 and FIG. 5, scribing is performed so that chip boundaries appear as side surfaces, and the resulting chips form light-emitting devices. As shown in FIG. 1, a light-emitting device is formed by mounting the chip so that the p-type GaN layer side of the chip comes into contact with the mounting section 21a of the lead frame. The conductive adhesive 14 applied to the mounting section secures the light-emitting device and the mounting section and also provides conductivity. Then, after wire bonding is performed to provide conductivity between the n-electrode 11 and the lead of the lead frame, an epoxy-based resin 15 is used to seal the structure in resin and form a lamp from the light-emitting device. In order to improve heat dissipation from the light-emitting device, it would be possible to have the entire surface of the p-type GaN layer of the light-emitting device come into contact with the mounting section. Also, an Ag-based adhesive, which has good heat conductivity, can be used for the conductive adhesive 14, and a CuW-based material, which has good heat conductivity, can be used for the lead frame.

Figure 6:
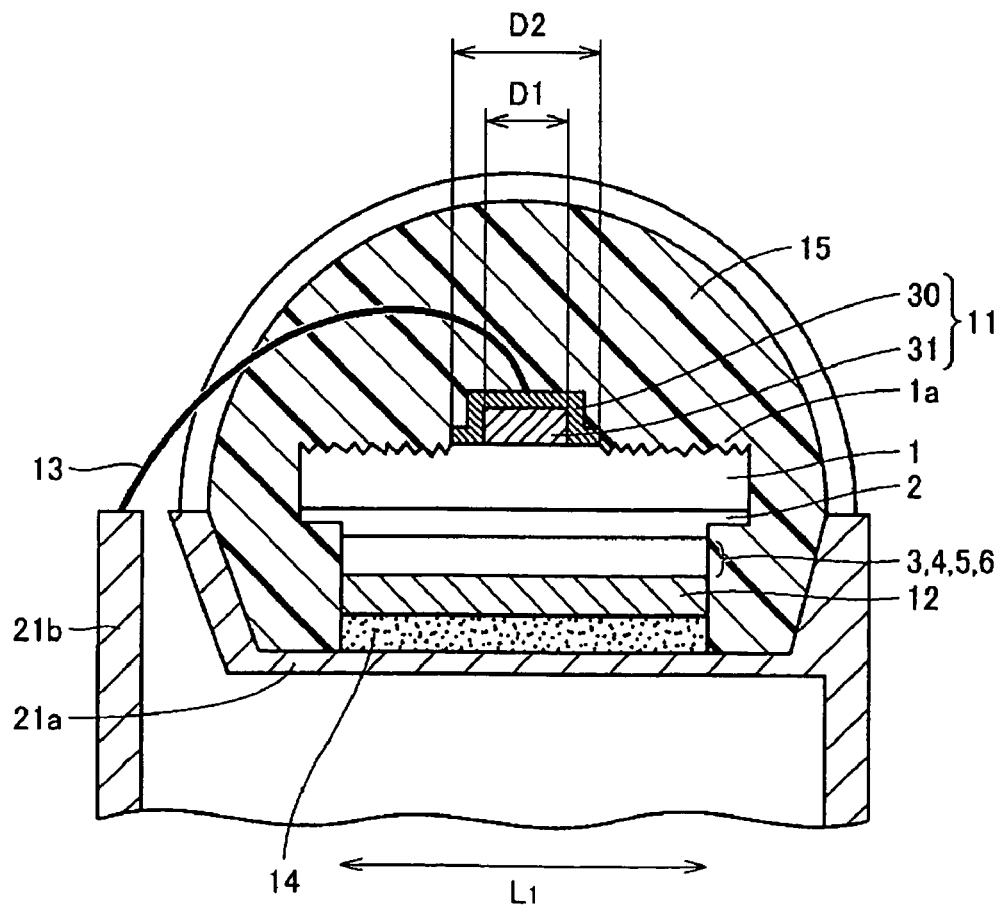
FIG. 6 is a drawing showing a first alternative example of an embodiment of an LED according to the present invention as shown in FIG. 1 through FIG. 5.
Figure 7:
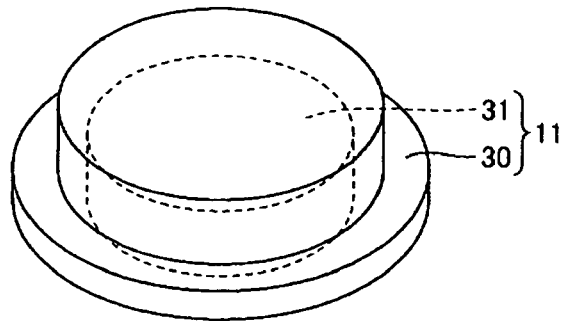
FIG. 7 is a simplified perspective drawing showing the n-electrode of the LED shown in FIG. 6.

FIG. 6 shows a first alternative example of an embodiment of an LED according to the embodiment of the present invention shown in FIG. 1 through FIG. 5. FIG. 7 is a simplified perspective drawing showing an n-electrode of the LED shown in FIG. 6. The first alternative example of an embodiment of an LED according to the present invention will be described, with references to FIG. 6 and FIG. 7.

The LED shown in FIG. 6 and FIG. 7 has essentially the same structure as the LED shown in FIG. 1 through FIG. 3, but the shape of the protective film 30 is different. More specifically, as shown in FIG. 7, the protective film 30 is formed to entirely cover an n-electrode base 31, which has a circular shape when seen from above. Stated another way, the protective film 30 extends over the top surface of the n-electrode base 31 so that it covers everything from the side wall of the n-electrode base 31 to the top surface. Also, the protective film 30 includes a flange 30a formed so that it extends from the center of the n-electrode base 31 outward on the second main surface 1a. The protective film 30 is formed from a conductor, and the n-electrode 11 is formed from the protective film 30 and the n-electrode base 31. The advantages of the LED shown in FIG. 1 through FIG. 3 can be provided with this structure. Furthermore, since the protective film 30 is formed to entirely cover the n-electrode base 31, the n-electrode 11 can be formed prior to performing the etching used to form cavities and projections without having the etching damage the n-electrode base 31 of the n-electrode 11.

Figure 8:
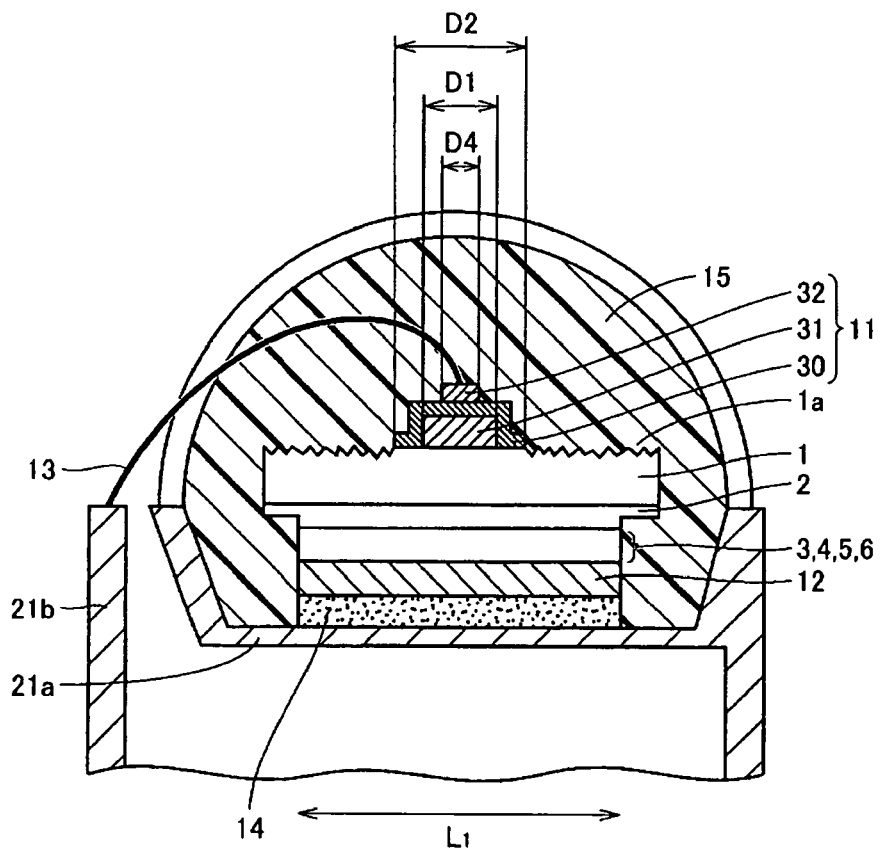
FIG. 8 is a drawing showing a second alternative example of an embodiment of an LED according to the present invention shown in FIG. 1 through FIG. 5.
Figure 9:
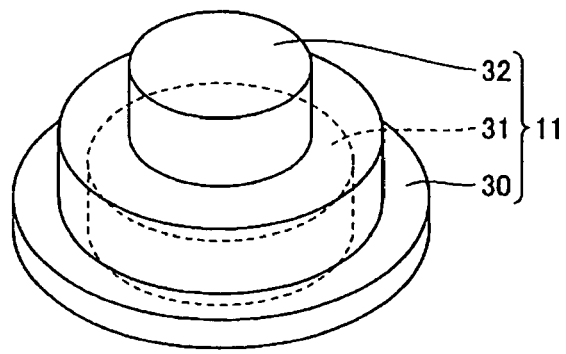
FIG. 9 is a simplified perspective drawing showing an n-electrode of the LED shown in FIG. 8.

FIG. 8 shows a second alternative example of an embodiment according to the present invention shown in FIG. 1 through FIG. 5. FIG. 9 is a simplified perspective drawing showing the n-electrode of the LED shown in FIG. 8.

The second alternative example of an embodiment of the LED according to the present invention will be described, with references to FIG. 8 and FIG. 9. The LED shown in FIG. 8 and FIG. 9 has essentially the same structure as the LED shown in FIG. 6 and FIG. 7, but an upper conductor 32 is formed on the upper surface of the protective film 30. More specifically, the n-electrode 11 is formed from the n-electrode base 31, the protective film 30, and the upper conductor 32. The n-electrode base 31, the protective film 30, and the upper conductor 32 are all formed from conductors. The advantages provided by the LED shown in FIG. 6 and FIG. 7 of the present application can be provided with this structure as well. Furthermore, by selecting a conductor material suited for connection to the wire 13 as the material for the upper conductor 32, it is possible to easily connect the wire 13 and the upper conductor 32.

FIRST EXAMPLE

In order to study the advantages of the light-emitting device according to the present invention, the samples described below were prepared and blue-light output values in response to predetermined currents were measured. The prepared samples will be described first.

(First invention sample): The LED of a first sample is equipped essentially with the same structure as the LED shown in FIG. 1 through FIG. 3. The method for making the LED of the first sample is also essentially the same as the method for making the light-emitting device described with reference to FIG. 4 and FIG. 5. This will be described in further detail.

(S1-1) An off-substrate of GaN with a 0.5 degree offset from the c-plane was used. The specific resistance of the substrate was 0.01 Ω·cm, the dislocation density was $1E7/cm^2$, and the thickness was 400 microns.

(S1-2) MOCVD (Metal Oxide Chemical Vapor Deposition) was used to form the following layered structure on the Ga surface, which is the first main surface of the GaN substrate: (Si-doped n-type GaN layer/Si-doped n-type $Al_{0.2}Ga_{0.8}N$ layer serving as a clad layer/multi-quantum well formed by stacking three two-layer structures of a GaN and an $In_{0.15}Ga_{0.85}N$ layer/Mg-doped p-type $Al_{0.2}Ga_{0.8}N$ layer serving as a clad layer/Mg-doped p-type GaN layer)

(S1-3) The wavelength of the emitted light was 450 nm, and the internal quantum efficiency was found to be 50% when approximated by comparing the PL (Photo-Luminescence) strength at a low temperature of 4.2 K and the PL strength at a room temperature of 298 K.

(S1-4) This wafer was activated and the resistance of the Mg-doped p-type layer was lowered. The carrier concentration determined by Hall measurement was 5E17 ($5 \times 10^{17}$)/$cm^3$ for the Mg-doped p-type $Al_{0.2}Ga_{0.8}N$ layer, and 1E18 ($1 \times 10^{18}$)/$cm^3$ for the Mg-doped p-type GaN layer.

(S1-5) This wafer was further etched with a Cl-based gas from the Mg-doped p-type layer side to the Si-doped n-type layer using photolithography and RIE (Reactive Ion Etching).

As shown in FIG. 4, this etching resulted in the formation of the element separation grooves 25, which separates the elements. The width $L_3$ of the element separation grooves 25 was 100 microns.

(S1-6) Photolithography, vapor deposition, and lift-off were performed on the N-surface, which is the second main surface of the GaN substrate, resulting in the formation of n-electrodes, which have circular shapes when seen from above, at the center of chips at a pitch of $L_2$=2 mm as shown in FIG. 4 (see FIG. 5). The n-electrodes were formed as layered structures (starting from the bottom, Ti layer 20 nm/Al layer 100 nm/Ti layer 20 nm/Au layer 200 nm) in contact with the GaN substrate 1. The contact resistance was reduced by heating the structure in a nitrogen ($N_2$) atmosphere.

(S1-7) The protective film 30 was formed as shown in FIG. 2 so that it covers the side wall of the n-electrode and extends to the outer perimeter of the upper surface of the n-electrode. Also, the protective film 30 includes a flange 30a that extends onto the second main surface adjacent to the n-electrode. In the protective film 30, the diameter (inner diameter) of the opening 35 formed on the upper surface of the n-electrode is 70 microns. Also, the outer diameter (the diameter of the outer perimeter of the flange 30a) D2 of the protective film 30 is 130 microns. As can be seen from FIG. 2, the position of the center of the protective film 30 (the center of the opening 35) is roughly aligned with the position of the center of the n-electrode 11. Nickel (Ni) was used as the material forming the protective film 30. Also, the thickness of the protective film 30 was 500 nm.

(S1-8) Next, a non-specular finish was applied to the N surface, which is the second main surface of the GaN substrate 1. In the non-specular finishing operation, selective wet etching was performed using an aqueous KOH solution as the etchant. An aqueous KOH solution of 8 mol/liter (l) was used as the etchant. The etchant and the sample (the GaN substrate in which the n-electrode 11 and the protective film 30 are formed on the N surface as described above) are placed in a sealed container, with the sample immersed in the etchant. Then, with the sealed container in a sealed state, the temperature inside the sealed container was set to 110 deg for 1 hour. As a result, cavities and projections were formed on the second main surface (N surface) of the GaN substrate 1. The average projection height of the cavities and projections was 15 microns. The Ga surface side, which is the side of the GaN substrate on which the layered structure is formed, was left as a specular surface without being etched. For the sealed container, any container can be used as long as it can hold the etchant and the sample inside and can provide isolation (sealing) from the outside. In order to set the temperature inside the sealed container to a predetermined temperature as described above, it would also be possible for the sealed container to be installed with a heating member such as a heater, a temperature measurement member for measuring the temperature inside the container, and a controller controlling the heating member such as a heater based on the temperature data detected by the temperature measurement member (by turning the heater on and off or by increasing or reducing the current supplied to the heater).

(S1-9) For the p-electrode, an Ni layer having a thickness of 4 nm was formed in contact with the p-type GaN layer, and an Au layer having a thickness of 4 nm was formed on the entire surface on top of this (see FIG. 4). This was heated in an inert gas atmosphere, resulting in a contact resistance of 5E-4 $\Omega \cdot cm^2$.

(S1-10) Then, as shown in FIG. 4, scribing was performed so that chip boundaries 50 appeared as side surfaces and the resulting chips formed light-emitting devices. The light-emitting device chips were formed so that the light emission surface was 1.9 mm□ (a square with sides having length 1.9 mm), and the light-emitting layer was 1.9 mm□. More specifically, in FIG. 5, $L_1$=1.9 mm, and $L_2$=2 mm. Also, the element separation groove width $L_3$=100 microns.

(S1-11) Referring to FIG. 1, the chip is mounted so that the p-type GaN layer side of the chip is in contact with the mounting section 21a of the lead frame, resulting in a light-emitting device. The conductive adhesive 14 applied to the mounting section secures the light-emitting device and the mounting section and provides conductivity.

(S1-12) In order to improve heat dissipation from the light-emitting device, the chip was mounted so that the entire surface of the p-type GaN layer of the light-emitting device comes into contact with the mounting section. Also, an Ag-based adhesive, which has good heat conductivity, was selected for the adhesive, and a CuW-based material, which has good heat conductivity, was selected for the lead frame. As a result, the obtained thermal resistance was 8 deg C/W.

(S1-13) Furthermore, after wire bonding the n-electrode and the lead of the lead frame to provide continuity, an epoxy-based resin was used to seal the structure in resin, forming a lamp from the light-emitting device.

Figure 10:
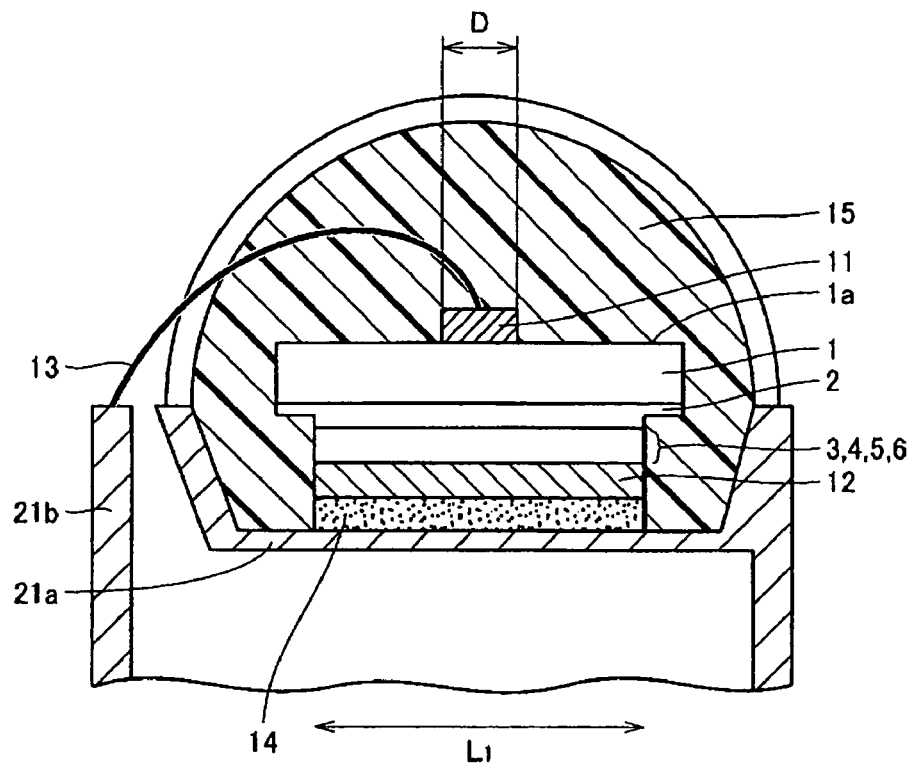
FIG. 10 is a simplified drawing showing an LED of a first comparative sample.

(First comparative sample): The LED of a first comparative sample is equipped with a structure essentially similar to that of the LED of the first example of the present invention, but, as shown in FIG. 10, cavities and projections are not formed on the N surface of the GaN substrate 1 (the N surface is in a specular state), and the protective film 30 (see FIG. 1) is not formed on the side wall of the n-electrode 11. FIG. 10 is a simplified drawing showing the LED of the first comparative sample.

The method for making the LED of the first comparative sample is as follows.

(S2-1)-(S2-6): Essentially the same as (S1-1)-(S1-6) of the first example of the present invention.

(S2-7)-(S2-11): Essentially the same as (S1-9)-(S1-13) of the first example of the present invention.

More specifically, the method for making the first comparative sample does not include the step (S1-7) for forming the protective film or the step (S1-8) for forming the cavities and projections by etching with the KOH aqueous solution as in the method for making the first example of the present invention.

Figure 11:
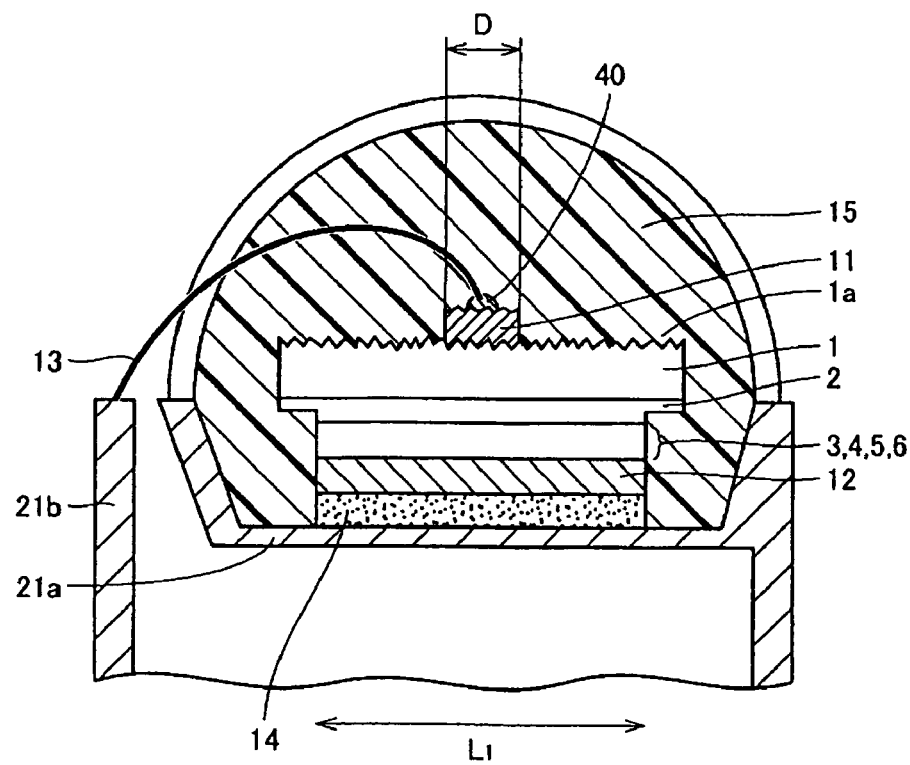
FIG. 11 is a simplified drawing showing an LED of a second comparative sample.

(Second comparative sample): The LED of the second comparative sample is equipped with a structure that is essentially the same as the LED of the first comparative sample described above, but, as shown in FIG. 11, cavities and projections are formed on the N surface, which is the second main surface of the GaN substrate 1, using a KOH aqueous solution. FIG. 11 is a simplified drawing showing the LED of the second comparative sample.

The method for making the LED of the second comparative sample is as follows.

(S3-1)-(S3-6): Essentially the same as (S1-1)-(S1-6) of the first example of the present invention.

(S3-7) was performed as a step identical to the step (S1-8) in the method for making the first example of the present invention (the selective wet etching step). However, as a result of this etching, the n-electrode was removed from the N surface of the GaN substrate. Also, in the section on which the n-electrode was formed, cavities and projections similar to those on the other sections of the N surface were formed. The average projection height of these cavities and projections was 15 microns. An attempt was made to form the n-electrode again on the N surface of the GaN substrate, but it was difficult to form the predetermined n-electrode using a method involving photolithography, vapor deposition, and lift-off as described in the step (S1-6) of the method for making the first example of the present invention. This is believed to be because the resist used in the photolithography technology remains in a localized manner at the cavities of the cavities and projections in the development step, thus hindering the formation of the n-electrode. In order to perform comparative tests, an n-electrode 11 having the same structure as the n-electrode in the step above was formed using metal masking. Then, the sample was heated in a nitrogen ($N_2$) atmosphere to lower the contact resistance.

(S3-8)-(S3-11): Essentially the same as (S1-9)-(S1-12) of the first example of the present invention.

(S3-12): An attempt was made to wire-bond the n-electrode and the lead of the lead frame but it was not possible to bond the wire and the upper surface of the n-electrode. In order to perform comparative tests, the wire 13 and the n-electrode 11 were bonded using the conductive paste 40 as shown in FIG. 11, and a lamp was formed.

(Tests and Results)

The first example of the present invention and the first and second comparative samples were installed in an integrating sphere. A predetermined current (4 A) was applied, the light was focused, and the light output values from a detector were compared. As a result, an output of 1.95 W was obtained from the first example of the present invention. Outputs of 1.6 W, 1.95 W were obtained from the first comparative sample and the second comparative sample.

Also, the contact resistance of the n-electrode of the first example of the present invention and the first and second comparative samples were measured using the TLM (Transmission Line Model) method. As a result, the contact resistance of the n-electrode of the first example of the present invention was found to be 1E-5 $\Omega \cdot cm^2$. The contact resistance outputs for the first comparative sample and the second comparative sample were 1E-5 $\Omega \cdot cm^2$, 1E-3 $\Omega \cdot cm^2$, respectively. The drive voltages were 4 V for the first example of the present invention and the first comparative sample, and 6 V for the second comparative sample.

Figure 12:
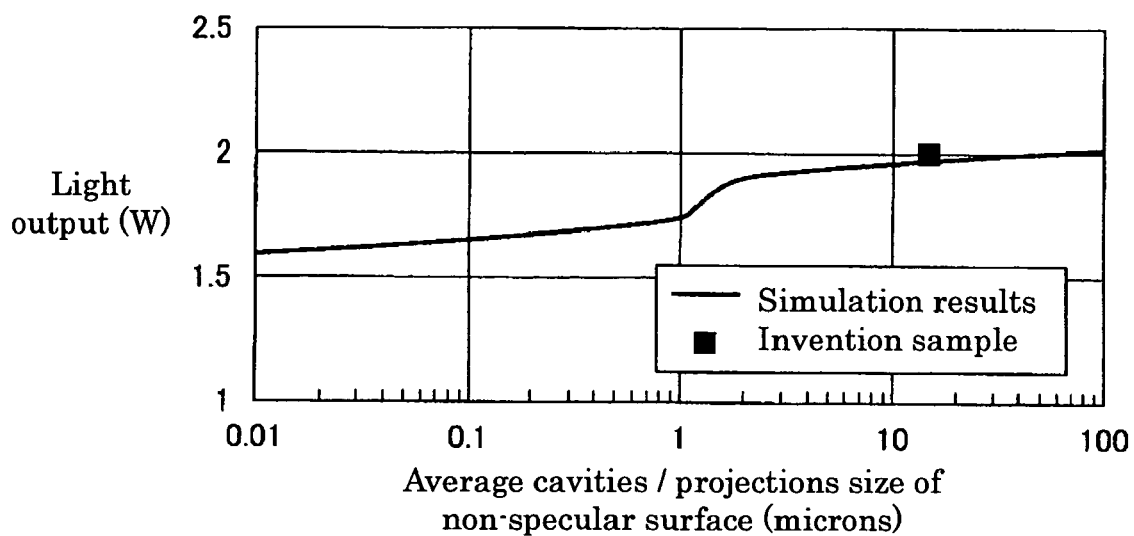
FIG. 12 is a graph showing the relationship between cavities/projections size and light output.

The relationship between the height of the projections in the cavities and projections formed on the N surface of the GaN substrate 1 (cavities/projections size) and light output were determined using a simulation. The results are shown in FIG. 12. FIG. 12 is a graph that shows the relationship between cavities/projections size and light output. Referring to FIG. 12, the horizontal axis is the average projection height of the cavities/projections section (non-specular surface) (average cavities/projections size) in units of microns. Also, the vertical axis is light output in units of W (watts). As shown in FIG. 12, light output especially improves when the projection height exceeds 1 micron. In FIG. 12, the data for the first example of the present invention is plotted with a black square, and it can be seen that the results are roughly the same as the results obtained from the simulation.

Next, although there may be some overlap with the examples described above, the examples of the present invention will be summarized below.

As shown in FIG. 1, FIG. 6, and FIG. 8, the light-emitting device according to the present invention is equipped with: a nitride semiconductor substrate (the GaN substrate 1); an n-type nitride semiconductor layer (the n-type $Al_xGa_{1-x}N$ layer 3) disposed on the first main surface side of the nitride semiconductor substrate; a p-type nitride semiconductor layer (the p-type $Al_xGa_{1-x}N$ layer 5) positioned further away from the nitride semiconductor substrate than the n-type nitride semiconductor layer; and a light-emitting layer (MQW: Multi-Quantum Well) positioned between the n-type nitride semiconductor layer and the p-type nitride semiconductor layer. The p-type nitride semiconductor layer side of the light-emitting device is down-mounted, and light is emitted from the second main surface 1a, which is the main surface opposite from the first main surface of the nitride semiconductor substrate. The second main surface 1a of the nitride semiconductor substrate includes a region on which cavities and projections are formed.

Also, the light-emitting device described above includes an electrode (the n-electrode 11 or the n-electrode base 31) formed on the second main surface 1a of the nitride semiconductor substrate; and the protective film 30 formed to cover the side wall of the electrode.

Since, as described above, in the light-emitting device according to the present invention, the protective film 30 is formed on the side wall of the electrode (the n-electrode 11 or the n-electrode base 31) in order to protect the side wall, when a non-specular finish is applied by etching the second main surface 1a of the GaN substrate, it is possible to reduce the probability of problems occurring such as the etching corroding the side wall of the n-electrode 11 or the n-electrode base 31, ultimately removing the n-electrode 11 or the like from the second main surface 1a of the GaN substrate 1. Also, by forming the protective film 30 on the side surface of the electrode in this manner, it is possible to form the electrode on the second main surface 1a of the GaN substrate 1 ahead of time before applying the non-specular finish described above. As a result, if the electrode is to be formed on the second main surface 1a after applying the non-specular finishing of the second main surface 1a, it is possible to prevent problems such as the unreliability of forming an electrode on the second main surface 1a after non-specular finishing has been applied (cavities and projections have been formed), e.g., a tendency for the n-electrode 11 or the like to be peeled away from the second main surface 1a.

By forming the protective film 30 on the side wall of the electrode in this manner, it is possible to reduce the number of production steps for the light-emitting device compared to other methods (e.g., a method in which a film is applied ahead of time on a region of the second main surface 1a on which the electrode (the n-electrode 11 or the n-electrode base 31) is to be formed, the non-specular finish is applied, the film is removed, and the electrode is then formed).

Also, by forming the protective film 30 on the side wall of the n-electrode 11 or the n-electrode base 31 as described above, it is possible to form the electrode ahead of time when the second main surface 1a is flat, before non-specular finishing is applied, thus maintaining good adhesion at the contact section between the electrode and the GaN substrate 1. As a result, the contact resistance at the contact section can be made adequately small, thus providing a light-emitting device with good luminous efficiency without increasing the drive voltage (power consumption) of the light-emitting device.

Since cavities and projections are formed on the second main surface 1a as described above, a greater surface area can be provided by the second main surface compared to if cavities and projections were not formed. As a result, light can be efficiently extracted from the cavities and projections, a light-emitting device with high light-extraction efficiency can be provided.

In the structure described above, the n-type electrode 11 is formed on the back surface (the second main surface) of the nitride semiconductor substrate (the GaN substrate 1), which has a low electrical resistance. Thus, current can flow through the entire nitride semiconductor substrate even if the n-electrode 11 is formed with a small covering ratio, i.e., a large opening ratio. As a result, the rate of light absorption at the emission surface is reduced, and light emission efficiency is improved. Of course, light can be emitted not only from the second main surface but also from the side surface. The same applies to the light-emitting device described below.

Also, the p-type nitride semiconductor layer side with the high electrical resistance is not the light emission surface, the p-type electrode layer (the p-electrode 12) can be formed over the entire surface of the p-type nitride semiconductor layer, thus providing a structure that is suitable for dissipating generated heat even if heat needs to be dissipated in response for a high current. More specifically, the restrictions imposed due to heat-related factors can be significantly relaxed. As a result, there is no need to reduce electrical resistance by, e.g., using a comb-shaped structure with interleaved p-electrodes and n-electrodes.

Furthermore, because the GaN substrate 1 has superior conductivity, there is no need to provide special protective circuitry for surge voltages, thus resulting in superior voltage resistance. Also, since there is no need to perform complicated processing, production can be made less expensive and performed more easily.

In the light-emitting device described above, the nitride semiconductor substrate can be formed from GaN or $Al_xGa_{1-x}N$ ($0<x<=1$). If the GaN substrate 1 is used as the nitride semiconductor substrate, a high current density can be applied, allowing the light-emitting device to emit light with high luminance and high luminous flux. Also, by forming the nitride semiconductor substrate from GaN or $Al_xGa_{1-x}N$ ($0<=x<=1$), it is possible to form the LED (light-emitting device) using a nitride semiconductor substrate with good heat conductivity, i.e., good heat dissipation. Thus, adequate heat dissipation is provided even when high current density is applied, making it possible to reduce damage to the LED from heat. This makes it possible to provide a light-emitting device that can output stable light over a long period of time.

In the light-emitting device described above, the protective film 30 can, as shown in FIG. 2, be formed with a ring-shaped outer shape that covers the side wall of the n-electrode 11 and extends along the outer wall of the n-electrode 11. The upper surface of the n-electrode 11 can include an exposed section that is not covered by the protective film 30. Also, in this light-emitting device, the material used in this protective film 30 can be either an insulator or a conductor. More specifically, for the material used in the protective film 30, examples of conductors include Ni, Au, Pt, Ag, W, Mo, Pd, Cu, Cr, and examples of insulators include $SiO_x$, $SiO_xN_{1-x}$, $SiN_x$.

In this case, it is possible to easily perform operations such as bonding a wire used for connecting to the outside of the chip to the exposed section of the upper surface of the n-electrode 11. Furthermore, since a section of the upper surface of the n-electrode 11 is exposed and this exposed section is used to provide a connection with the outside with the wire 13 or the like, it is possible to use insulative materials as well as conductive materials for the protective film 30 formed on the side wall of the n-electrode 11. Thus, there is a greater degree of freedom regarding the material used in the protective film 30.

As shown in FIG. 6 and FIG. 8, in the light-emitting device described above, the protective film 30 can be formed from a conductor and can extend from the side wall of the n-electrode base 31 serving as the electrode to the upper surface so that it covers the upper surface. In this case, since the protective film 30 covers the entire n-electrode base 31, it is possible to reduce the possibility that the n-electrode base 31 will be damaged by the etchant used in etching performed for the non-specular finishing operation. Thus, since the possibility that the etching will remove the n-electrode base 31 from the second main surface 1*a* is reduced, the application of non-specular finishing (the formation of cavities and projections) makes it possible to reliably provide a light-emitting device with improved light extraction efficiency.

As shown in FIG. 8 and FIG. 9, the light-emitting device can also include an upper electrode (an upper conductor 32) formed on the protective film 30. By forming the upper conductor 32 from material suited for wire bonding, it is possible to reliably and easily perform wire bonding to connect the upper conductor 32 with an external terminal or the like. Examples of materials that can be used for the upper conductor 32 include Au and Al.

In the light-emitting device described above, the cavities and projections can be formed by etching the second main surface. It is possible that the side wall of the electrode (the n-electrode 11 or the n-electrode base 31) can be damaged by the etching performed to form the cavities and projections, but the present invention is able to reliably prevent this type of damage to the side wall of the electrode from etching with the protective film 30. In other words, the present invention is especially effective in light-emitting devices in which cavities and projections are formed with etching.

In the light-emitting device described above, the nitride semiconductor substrate can be the GaN substrate 1, and it would be preferable for the etching to be implemented as wet etching using a KOH solution as the etchant (etching solution). Also, it would be preferable for the second main surface 1*a* to be an N surface.

By using KOH as the etchant, cavities and projections can be easily formed on the N surface, which is the second main surface. This simplifies the operation compared to forming the cavities and projections through machining, e.g., dicing. As a result, the production costs of the light-emitting device can be reduced.

In the light-emitting device described above, the material used for the electrode (the n-electrode 11 or the n-electrode base 31) can be at least one of the elements selected from the group of aluminum (Al), tungsten (W), and platinum (Pt). The electrode can be formed as a layered structure formed from multiple layers, and the outermost layer (uppermost layer) of the multiple layers as seen from the second main surface 1*a* can contain gold (Au). This makes it possible to form an electrode with low contact resistance with the nitride semiconductor substrate (the GaN substrate 1). As a result, a light-emitting device with superior light-emitting efficiency can be provided without increasing the drive voltage (power consumption) of the light-emitting device. Also, since the uppermost layer of the electrode contains gold, a wire formed from gold can be easily connected (wire-bonded) to the uppermost layer of the electrode, as shown in FIG. 1 and the like.

In the light-emitting device described above, the structure of the electrode (the n-electrode 11 or the n-electrode base 31) can be: a layered structure formed from, starting from the second main surface 1*a*, titanium (Ti)/aluminum (Al)/titanium (Ti)/gold (Au); a layered structure formed from Ti/Al/

Au; a layered structure formed from W/Au; or a layered structure formed from Ti/platinum (Pt)/Au.

In the light-emitting device described above, the projection height of the cavities and projections formed on the second main surface $1a$ of the GaN substrate 1 can be at least 1 micron and no more than 300 microns. Also, it would be preferable for the projection height to be at least 2 microns, and at least 3 microns more preferably. Also, it would be preferable for the projection height to be no more than 200 microns, more preferably no more than 100 microns, and yet more preferably no more than 50 microns.

The inventor found that if the light to the extracted from the light-emitting device is blue light, setting the projection height to be at least 1 micron dramatically improves the light-extraction efficiency. As a result, it would be preferable for the projection height to be at least 1 micron. Also, if the projection height is at least 2 microns, it would be possible to reliably provide improved light extraction efficiency. Furthermore, if the projection height is approximately 300 microns, there is a saturation in the improvement in light extraction efficiency. Thus, the upper limit of the projection height is set to 300 microns. A projection height of greater than 300 microns provides almost no improvement in light extraction efficiency while increasing the processing time required for processing the projections, resulting in increased production costs for the light-emitting device. Also, if the projection height is greater than 300 microns, through-holes may form at sections of the substrate due to the thickness of the initially prepared nitride semiconductor substrate or, even if through-holes are not formed, the substrate at the bottoms of the cavities of the cavities and projections will be too thin, resulting in a tendency for the substrate to break during subsequent processing.

The projection height described above can be the average height of the projections. Average height can be determined by measuring a predetermined number of projections and calculating the average value thereof. More specifically, three points can be picked randomly on the N surface of the substrate and heights can be measured for five randomly selected projections within the field of view when viewed at a predetermined magnification. The height data for the 3×5×15 projections can be measured, and the average value of the height data can be calculated to determine the average height.

The embodiments and examples disclosed herein are simply examples and are not restrictive. The scope of the present invention is indicated not in the description above but in the claims and includes all modifications within the scope of equivalences of the claims.

In the light-emitting device of the present invention, a nitride semiconductor substrate having high conductivity is used, cavities and projections are formed on the light exit surface by performing selective wet etching, and a protective film is formed ahead of time on the side wall of the n-electrode. As a result: (1) light extraction efficiency can be improved while the possibility that the n-electrode is removed (damaged) by wet etching can be reduced; (2) superior heat dissipation is provided, the need to provide complex electrode structures is eliminated, and high-output light emission is made possible; (3) superior conductivity is provided, the need to provide a protection circuit to protect the light-emitting element from static discharge and transient voltage is eliminated, and superior large-area light emission and static voltage resistance is provided; (4) since there are no significant discontinuities from high index of refraction to low index of refraction going from the light-emitting layer to the substrate, total internal reflection between the light-emitting layer and the emission surface tends not to occur, which prevents reduced efficiency and resin degradation at the side surface caused by total internal reflection, thus making the present invention suitable for a wide range of lighting products such as automotive lighting devices.

What is claimed is:

1. A light-emitting device comprising:
a nitride semiconductor substrate;
an n-type nitride semiconductor layer on a first main surface side of said nitride semiconductor substrate;
a p-type nitride semiconductor layer positioned further away from said nitride semiconductor substrate compared to said n-type nitride semiconductor layer; and
a light-emitting layer positioned between said n-type nitride semiconductor layer and said p-type nitride semiconductor layer,
wherein said p-type nitride semiconductor layer side is down-mounted and light is emitted from a second main surface, which is a main surface opposite from said first main surface of said nitride semiconductor substrate;
said second main surface of said nitride semiconductor substrate includes a region formed with cavities and projections;
an electrode is formed on said second main surface of said nitride semiconductor substrate; and
a protective film is formed only on a side wall of said electrode, a portion of said second main surface adjacent to said electrode and an outer perimeter portion of a top surface of said electrode to cover a side wall of said electrode,
wherein:
the side wall covered by the protective film is an outermost surface of said electrode in a planar direction parallel to the first main surface of said nitride semiconductor substrate, and
the protective film comprises an insulator including at least one material selected from the group consisting of $SiO_x$, $SiO_xN_{1-x}$, and $SiN_x$.

2. A light-emitting device according to claim 1 wherein said protective film is formed with a ring-shaped outer shape that covers said side wall of said electrode and extends along an outer perimeter of said electrode; and an upper surface of said electrode includes a section that is exposed and uncovered by said protective film.

3. A light-emitting device according to claim 1 wherein said protective film is extended from said side wall of said electrode to cover an upper surface of said electrode.

4. A light-emitting device according to claim 3 further comprising: an
upper electrode formed on said protective film.

5. A light-emitting device according to claim 1 wherein said cavities/projections section is formed by etching said second main surface.

6. A light-emitting device according to claim 1 wherein a material used to form said electrode is at least one material selected from the group of aluminum, tungsten, and platinum; said electrode includes a layered structure formed from a plurality of layers, with an outermost layer of said plurality of layers as seen from said second main surface containing gold.

7. A light-emitting device according to claim 1 wherein a projection height of said cavities/projections section is at least 1 micron and no more than 300 microns.

8. A light-emitting device comprising:
a nitride semiconductor substrate;
an n-type nitride semiconductor layer on a first main surface side of said nitride semiconductor substrate;

a p-type nitride semiconductor layer positioned further away from said nitride semiconductor substrate compared to said n-type nitride semiconductor layer; and a light-emitting layer positioned between said n-type nitride semiconductor layer and said p-type nitride semiconductor layer, wherein said p-type nitride semiconductor layer side is down-mounted and light is emitted from a second main surface, which is a main surface opposite from said first main surface of said nitride semiconductor substrate;

said second main surface of said nitride semiconductor substrate includes a region formed with cavities and projections;

an electrode is formed on said second main surface of said nitride semiconductor substrate; and a protective film is formed only on a side wall of said electrode, a portion of said second main surface adjacent to said electrode and an outer perimeter portion of a top surface of said electrode to cover a side wall of said electrode, wherein:

the side wall covered by the protective film is an outermost surface of said electrode in a planar direction parallel to the first main surface of said nitride semiconductor substrate, and the protective film comprises a conductor.

9. A light-emitting device according to claim 8 wherein said protective film is formed with a ring-shaped outer shape that covers said side wall of said electrode and extends along an outer perimeter of said electrode; and an upper surface of said electrode includes a section that is exposed and uncovered by said protective film.

10. A light-emitting device according to claim 8 wherein said protective film is extended from said side wall of said electrode to cover an upper surface of said electrode.

11. A light-emitting device according to claim 10 further comprising: an upper electrode formed on said protective film.

12. A light-emitting device according to claim 8 wherein said cavities/projections section is formed by etching said second main surface.

13. A light-emitting device according to claim 8 wherein a material used to form said electrode is at least one material selected from the group of aluminum, tungsten, and platinum; said electrode includes a layered structure formed from a plurality of layers, with an outermost layer of said plurality of layers as seen from said second main surface containing gold.

14. A light-emitting device according to claim 8 wherein a projection height of said cavities/projections section is at least 1 micron and no more than 300 microns.

15. A light-emitting device according to claim 8 wherein the protective film comprises a conductor including at least one material selected from the group consisting of Ni, Au, Pt, Ag, W, Mo, Pd, Cu and Cr.

* * * * *